(12) United States Patent
Forbes

(10) Patent No.: US 7,319,613 B2
(45) Date of Patent: *Jan. 15, 2008

(54) NROM FLASH MEMORY CELL WITH INTEGRATED DRAM

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/415,384

(22) Filed: May 1, 2006

(65) Prior Publication Data

US 2006/0215452 A1 Sep. 28, 2006

Related U.S. Application Data

(63) Continuation of application No. 11/159,692, filed on Jun. 23, 2005, now Pat. No. 7,072,213, which is a continuation of application No. 10/775,424, filed on Feb. 10, 2004, now Pat. No. 6,952,366.

(51) Int. Cl.
*G11C 14/00* (2006.01)

(52) U.S. Cl. ............... 365/185.08; 365/185.18; 365/149

(58) Field of Classification Search ........... 365/185.08, 365/185.18, 149
See application file for complete search history.

(56) References Cited

U.S. PATENT DOCUMENTS

| | | | |
|---|---|---|---|
| 4,184,207 A | 1/1980 | McElroy | |
| 4,420,504 A | 12/1983 | Cooper | |
| 4,755,864 A | 7/1988 | Ariizumi | |
| 4,881,114 A | 11/1989 | Mohsen | |
| 5,241,496 A | 8/1993 | Lowrey | |
| 5,330,930 A | 7/1994 | Chi | |
| 5,378,647 A | 1/1995 | Hong | |

(Continued)

FOREIGN PATENT DOCUMENTS

EP 84303740.9 1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner*—Huan Hoang
(74) *Attorney, Agent, or Firm*—Leffert Jay & Polglaze, P.A.

(57) ABSTRACT

A memory device that is comprised of a dynamic random access memory (DRAM) capacitor and a nitride read only memory (NROM) transistor. The memory device provides multiple modes of operation including a DRAM mode using the capacitor and a non-volatile random access memory mode using the NROM transistor. The device is comprised of two source/drain regions between which a gate insulator layer is formed. A control gate, coupled to a word line, is formed on top of the gate insulator. The DRAM capacitor is coupled to one of the source/drain regions while the second source/drain region is coupled to a bit line that is eventually coupled to a sense amplifier for reading the state or states of the memory device.

19 Claims, 5 Drawing Sheets

U.S. PATENT DOCUMENTS

| | | | |
|---|---|---|---|
| 5,379,253 A | 1/1995 | Bergemont |
| 5,397,725 A | 3/1995 | Wolstenholme |
| 5,467,305 A | 11/1995 | Bertin |
| 5,576,236 A | 11/1996 | Chang |
| 5,768,192 A | 6/1998 | Eitan |
| 5,792,697 A | 8/1998 | Wen |
| 5,858,841 A | 1/1999 | Hsu |
| 5,867,405 A | 2/1999 | Jiang |
| 5,911,106 A | 6/1999 | Tasaka |
| 5,946,558 A | 8/1999 | Hsu |
| 5,966,603 A | 10/1999 | Eitan |
| 5,994,745 A | 11/1999 | Hong |
| 6,009,011 A | 12/1999 | Yamauchi |
| 6,011,725 A | 1/2000 | Eitan |
| 6,028,342 A | 2/2000 | Chang |
| 6,030,871 A | 2/2000 | Eitan |
| 6,044,022 A | 3/2000 | Nachumovsky |
| 6,081,456 A | 6/2000 | Dadashev |
| 6,108,240 A | 8/2000 | Lavi |
| 6,133,102 A | 10/2000 | Wu |
| 6,134,156 A | 10/2000 | Eitan |
| 6,147,904 A | 11/2000 | Liron |
| 6,157,570 A | 12/2000 | Nachumovsky |
| 6,172,396 B1 | 1/2001 | Chang |
| 6,174,758 B1 | 1/2001 | Nachumovsky |
| 6,175,523 B1 | 1/2001 | Yang |
| 6,175,908 B1 | 1/2001 | Pickett |
| 6,181,597 B1 | 1/2001 | Nachumovsky |
| 6,184,089 B1 | 2/2001 | Chang |
| 6,201,282 B1 | 3/2001 | Eitan |
| 6,201,737 B1 | 3/2001 | Hollmer |
| 6,204,529 B1 | 3/2001 | Lung |
| 6,207,504 B1 | 3/2001 | Hsieh |
| 6,208,557 B1 | 3/2001 | Bergemont |
| 6,215,702 B1 | 4/2001 | Derhacobian |
| 6,218,695 B1 | 4/2001 | Nachumovsky |
| 6,222,768 B1 | 4/2001 | Hollmer |
| 6,240,020 B1 | 5/2001 | Yang |
| 6,243,300 B1 | 6/2001 | Sunkavalli |
| 6,251,731 B1 | 6/2001 | Wu |
| 6,255,166 B1 | 7/2001 | Ogura |
| 6,256,231 B1 | 7/2001 | Lavi |
| 6,266,281 B1 | 7/2001 | Derhacobian |
| 6,269,023 B1 | 7/2001 | Derhacobian |
| 6,272,043 B1 | 8/2001 | Hollmer |
| 6,275,414 B1 | 8/2001 | Randolph |
| 6,282,118 B1 | 8/2001 | Lung |
| 6,291,854 B1 | 9/2001 | Peng |
| 6,297,096 B1 | 10/2001 | Boaz |
| 6,303,436 B1 | 10/2001 | Sung |
| 6,327,174 B1 | 12/2001 | Jung |
| 6,348,711 B1 | 2/2002 | Eitan |
| 6,392,930 B2 | 5/2002 | Jung |
| 6,417,053 B1 | 7/2002 | Kuo |
| 6,421,275 B1 | 7/2002 | Chen |
| 6,429,063 B1 | 8/2002 | Eitan |
| 6,432,778 B1 | 8/2002 | Lai |
| 6,461,949 B1 | 10/2002 | Chang |
| 6,468,864 B1 | 10/2002 | Sung |
| 6,469,342 B1 | 10/2002 | Kuo |
| 6,477,084 B1 | 11/2002 | Eitan |
| 6,486,028 B1 | 11/2002 | Chang |
| 6,487,050 B1 | 11/2002 | Liu |
| 6,498,377 B1 | 12/2002 | Lin |
| 6,514,831 B1 | 2/2003 | Liu |
| 6,531,887 B2 | 3/2003 | Sun |
| 6,545,309 B1 | 4/2003 | Kuo |
| 6,552,387 B1 | 4/2003 | Eitan |
| 6,559,013 B1 | 5/2003 | Pan |
| 6,576,511 B2 | 6/2003 | Pan |
| 6,580,135 B2 | 6/2003 | Chen |
| 6,580,630 B1 | 6/2003 | Liu |
| 6,602,805 B2 | 8/2003 | Chang |
| 6,607,957 B1 | 8/2003 | Fan |
| 6,610,586 B1 | 8/2003 | Liu |
| 6,613,632 B2 | 9/2003 | Liu |
| 6,617,204 B2 | 9/2003 | Sung |
| 6,873,550 B2 * | 3/2005 | Mihnea ............... 365/185.19 |
| 7,072,213 B2 * | 7/2006 | Forbes ............... 365/185.08 |
| 7,099,181 B2 * | 8/2006 | Ahn et al. ............... 365/149 |
| 2001/0001075 A1 | 5/2001 | Ngo |
| 2001/0004332 A1 | 6/2001 | Eitan |
| 2001/0011755 A1 | 8/2001 | Tasaka |
| 2002/0142569 A1 | 10/2002 | Chang |
| 2002/0146885 A1 | 10/2002 | Chen |
| 2002/0151138 A1 | 10/2002 | Liu |
| 2002/0177275 A1 | 11/2002 | Liu |
| 2002/0182829 A1 | 12/2002 | Chen |
| 2003/0057997 A1 | 3/2003 | Sun |
| 2003/0067807 A1 | 4/2003 | Lin |
| 2003/0117861 A1 | 6/2003 | Maayan |
| 2004/0052112 A1* | 3/2004 | Lin et al. ............... 365/185.18 |
| 2005/0041474 A1 | 2/2005 | Ahn et al. |

FOREIGN PATENT DOCUMENTS

| | | |
|---|---|---|
| EP | 90115805.5 | 2/1991 |
| EP | 01113179.4 | 12/2002 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Non-volatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41st Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after $10^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "$E^2$PROM Product Issues and Technology Trends," IEEE 1989, pp. 17-19, Copryright 1989 IEEE.

T. Huang, F. Jong, T. Chao, H. Lin, L. Leu, K. Young, C. Lin, K. Chiu, "Improving Radiation Hardness of EEPROM/Flash Cell BY $N_2O$ Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide -Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With A TiSi$_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, date unknown.

T. Sugizaki, et al. "New 2-bit/Tr MONOS Type Flash Memory using Al$_2$O$_3$ as Charge Trapping Layer," Fujitsu Laboratories Ltd, date unknown.

T. Saito, et al. "Hot Hole Erase Characteristics and Reliability in Twin MONOS Device" Halo LSI, date unknown.

Saifun Semiconductors, LTD. PowerPoint Presentation, date unknown.

Y. Roizin, et al. "Novel Techniques for data retention and Leff measurements in two bit MicroFlash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™-a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001, pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., date unknown.

L. Breuil, et al., "A new 2 isolated-bits/cell flash memory device with self aligned split gate structure using ONO stacks for charge storage," IMEC, date unknown.

J. Willer, et al., "UMEM: A U-shape Non-Volatile-Memory Cell," Ingentix GmbH &Co. KG., Infineon Technologies and Saifun Semiconductors, date unknown.

S. Kang, et al., "A Study of SONOS Nonvolatile Memory Cell Controlled Structurally by Localizing Charge-Trapping Layer," Samsung Electrons Co., Ltd., date unknown.

Y. Roizin, et al., "In-Process Charging in microFLASH® Memory Cells," Tower Semiconductor, Ltd., date unknown.

A Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, date unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., date unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, date unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., date unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, date unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, date unknown.

Y. Roizin, et al., "Retention Characteristics of microFLASH® Memory (Activation Energy of Traps in the ONO Stack)," Tower Semiconductor, Ltd., date unknown.

Y. Roizin, et al., "Activation Energy of Traps in the ONO Stack of microFLASH® Memory Cells," Tower Semiconductor, Ltd., date unknown.

Y. Roizin, et al., "'Dummy' Gox for Optimization of microFLASH® Technology," Tower Semiconductor, Ltd., date unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., date unknown.

J. Bu, et al., "Retention Reliability Enhanced SONOS NVSM with Scaled Programming Voltage," Microelectronics Lab., date unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance," Nikkei Microdevices, Nov. 1999, pp. 147-148.

J.H. Ahn, "An Experimental 256Mb Non-Volatile DRAM with Cell Plate Boosted Programming Technique," 2004 IEEE International Solid-State Circuits Conference, San Francisco, Feb. 2004, pp. 42-43, Copyright 2004 IEEE.

* cited by examiner

NROM FLASH MEMORY CELL WITH INTEGRATED DRAM

RELATED APPLICATION

This Application is a Continuation of U.S. application Ser. No. 11/159,692, titled "NROM FLASH MEMORY CELL WITH INTEGRATED DRAM," filed Jun. 23, 2005, now U.S. Pat. No. 7,072,213, which is a Continuation of U.S. application Ser. No. 10/775,424, filed Feb. 10, 2004, now U.S. Pat. No. 6,952,366, issued on Oct. 4, 2005, which is commonly assigned and incorporated herein by reference.

TECHNICAL FIELD OF THE INVENTION

The present invention relates generally to memory devices and in particular the present invention relates to dynamic random access memory and nitride read only memory flash memory architecture.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile flash memory. One type of flash memory is a nitride read only memory (NROM). NROM has some of the characteristics of flash memory but does not require the special fabrication processes of flash memory. NROM integrated circuits can be implemented using a standard CMOS process.

DRAM's are the most cost-effective, high-speed memory. They have an almost indefinite number of read/write cycles. DRAM's are also available in very high-density configurations. Some drawbacks to DRAM's, however, is that they can only store data for a short time without being refreshed and, once power is removed, the data is lost.

Flash memory devices do not require refreshing and can store data indefinitely after the power is removed. These devices, however, have a relatively slow write operation when compared to a DRAM. An additional drawback is that flash memory devices have a limited number of read/write cycles.

Attempts have been made at combining DRAM or SRAM with non-volatile memory. These devices have an area of DRAM or SRAM cells and an area of non-volatile memory cells. This either increases the size required for a given amount of memory or decreases the memory density possible on a die.

For the reasons stated above, and for other reasons stated below which will become apparent to those skilled in the art upon reading and understanding the present specification, there is a need in the art for a memory device having the attributes of both DRAM and non-volatile memory.

DETAILED DESCRIPTION

Figure 1:
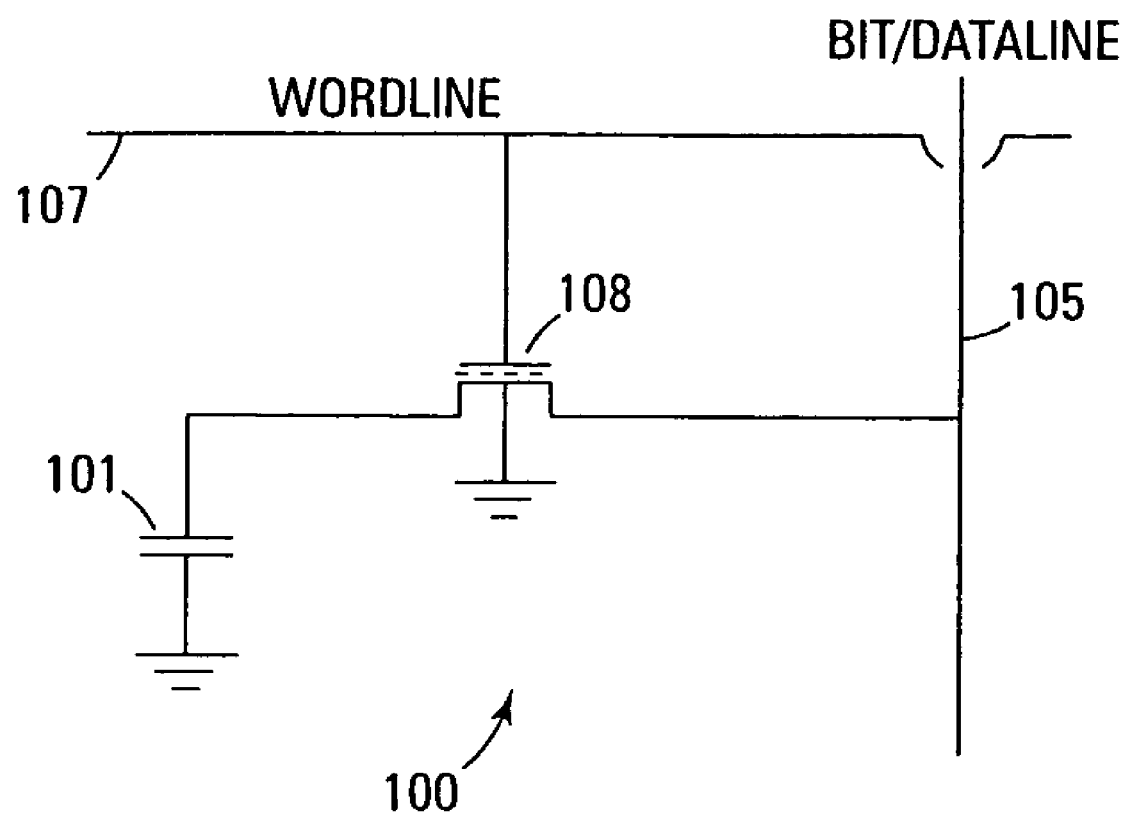
FIG. 1 shows a schematic diagram of one embodiment of a DRAM cell with a repressed NROM cell of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

The DRAM cell with repressed NROM cell of the present invention provides a one transistor/one capacitor memory cell that has two modes of operation. The first mode is a dynamic random access memory mode. The second mode is a non-volatile random access memory (NVRAM) mode utilizing the NROM transfer device as an NROM cell device.

FIG. 1 illustrates a schematic diagram of one embodiment of the DRAM cell with the repressed NROM memory of the present invention. The embodiment is comprised of a DRAM capacitor 101 that is connected between ground and the NROM memory cell 108. The NROM cell 108 acts as a transfer gate for the DRAM capacitor 101 since it is between the bit/data line 105 and the DRAM cell 101. A word line 107 connects the control gates of all of the NROM cells in a row of cells of a memory array. The bit lines 105 and word lines 107 are well known in the art and are not discussed further.

When the memory device 100 is in the NVRAM mode, the NROM cell 108 can act as a non-volatile memory cell whose data is completely independent of the DRAM cell 101. In this mode, the NROM cell 108 operates with the same read/program/erase characteristics as a flash memory cell. The read, program, and erase operations of flash memory cells are well known in the art and are not discussed further.

Also in the NVRAM mode, the NROM cell 108 can act as a shadow memory cell such that a charge stored in the DRAM cell 101 is stored in the NROM cell 108. By applying a large negative voltage to the word line 107 for a few milliseconds, the data from the DRAM capacitor 101 is written into the NVRAM NROM cell 108. Thus, when power is removed, the data from the DRAM is stored in a non-volatile fashion. In this embodiment, the memory device's controller (discussed subsequently) executes a programming operation of the NROM cell 108 when a power-down is detected. This enables the memory device 100 to act as a NVDRAM.

If the DRAM capacitor 101 is not charged during this programming operation, any charge in the nitride trapping layer would remain. This is due to the voltage difference across the gate insulator between the source and drain regions not being large enough to cause tunneling.

When the memory device 100 is in the DRAM mode, the data is stored and read from the DRAM cell 101. The cell 101 has to be refreshed in a normal DRAM fashion as is well known in the art. In this mode, the NROM cell 108 acts as a transfer gate for the data to be read on the bit line 105.

Figure 2:
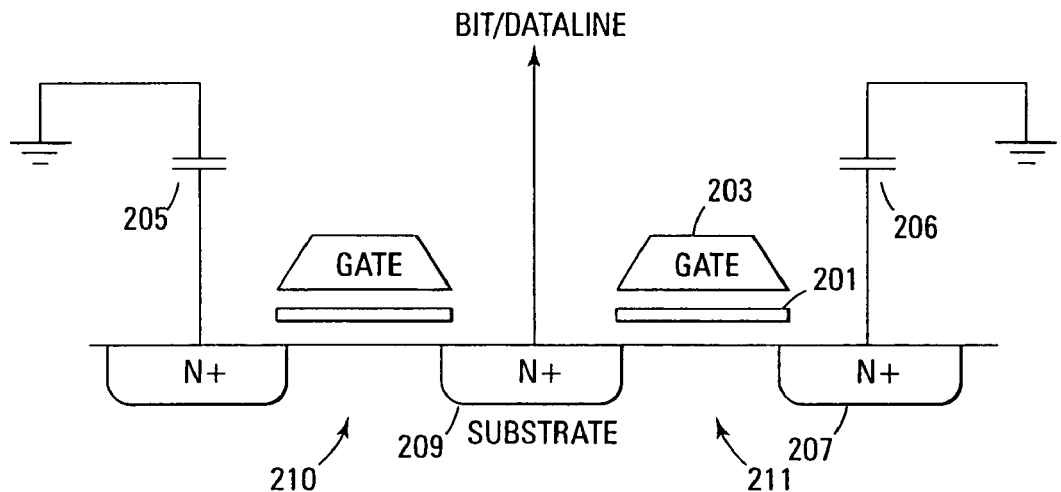
FIG. 2 shows a cross-sectional view of one embodiment of two DRAM cells of the present invention with NROM transfer gates.

FIG. 2 illustrates a cross-sectional view of two DRAM cells 205 and 206 of the present invention with NROM transfer gates 210 and 211 respectively. Both NROM transistors 210 and 211 are substantially similar; therefore the description of one applies to the other.

Each NROM cell 210 and 211 is comprised of two n+ doped regions 207 and 209 in the substrate. These regions are the source and drain areas for each NROM transistor 210 and 211.

Between the doped regions 207 and 209 is the nitride storage layer 201. In one embodiment, this layer is an oxide-nitride-oxide (ONO) composite layer. Alternate embodiments use other gate insulators besides the ONO structure shown. These structures include oxide-nitride-aluminum oxide composite layers, oxide-aluminum oxide-oxide composite layers, oxide, silicon oxycarbide-oxide composite layers as well as other composite layers.

In still other alternate embodiments, the gate insulator could include thicker than normal silicon oxides formed by wet oxidation and not annealed, silicon rich oxides with inclusions of nanoparticles of silicon, silicon oxynitride layer that are not composite layers, silicon rich aluminum oxide insulators that are not composite layers, silicon oxycarbide insulators that are not composite layers, silicon oxide insulators with inclusions of nanoparticles of silicon carbide, in addition to other non-stoichiometric single layers of gate insulators of two or more commonly used insulator materials such as Si, N, Al, Ti, Ta, Hf, Zr, and La.

The control gate 203 is a polysilicon structure formed over the gate insulator layer 201. The control gate 203 is also the word line that is coupled to other NROM transistors. The bit/data line is coupled to the common source/drain region 209 that is an element of both transistors 210 and 211. The bit/data line is eventually coupled to sense amplifiers in order to read the data stored in the NROM/DRAM cells. The sense amplifiers are discussed subsequently with reference to the system of FIG. 7.

Data is written into the DRAM cell 205 or 206 when the word line of the respective NROM memory cell 210 or 211 is at a first potential. Data is written into the NROM cell 210 or 211 when the word line is at a second potential that is higher in magnitude than the first potential but less than the maximum operating voltage of the transistor.

Figure 3:
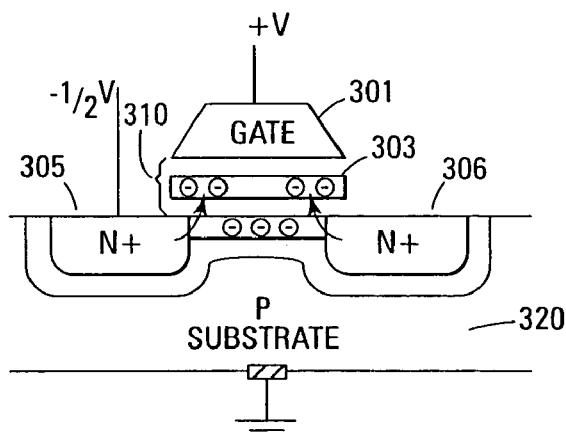
FIG. 3 shows a cross-sectional view of one embodiment of a write operation to the NROM cell using an electron tunneling process.

FIG. 3 illustrates a cross-sectional view of one embodiment of a write operation to an NROM cell using an electron tunneling process. This embodiment uses a positive gate voltage applied to the control gate 301 and −½ Volt source bias 305. The voltage difference across the gate insulator 310 between the source 305 and drain 306 regions, in one embodiment, is large enough to allow direct tunneling to the nitride trapping layer 303. Alternate embodiments use other voltages. In this embodiment, the substrate 320 is grounded.

In this embodiment, the substrate 320 is a p-type conductivity material and the source/drain regions 305 and 306 are n-type conductivity material. However, these types of silicon may be reversed in alternate embodiments. In such an embodiment, the gate voltage will be a negative bias while the source bias will be positive.

Figure 4:
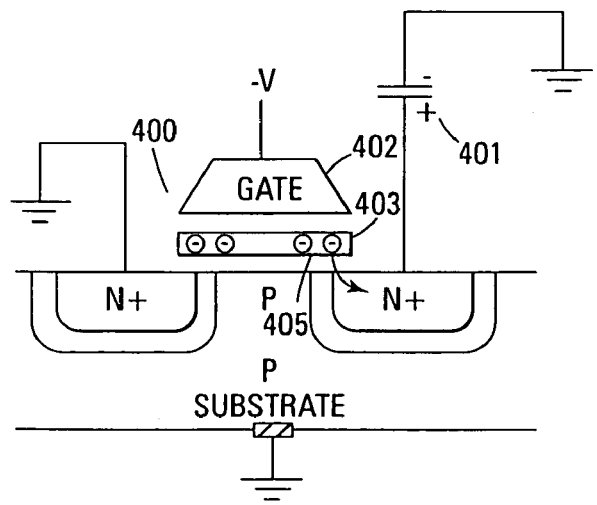
FIG. 4 shows a cross-sectional view of one embodiment of an erase operation of an NROM cell with a charged DRAM capacitor.

FIG. 4 illustrates a cross-sectional view of one embodiment of an erase operation of an NROM cell. In this embodiment, electron trapping and detrapping is only employed at one end of the channel for the NVRAM memory function.

To erase the data stored in the NROM cell 400 the DRAM capacitor 401 is fully charged and a negative voltage is applied to the word line and gate 402 of the NROM device 400. This causes the electrons to tunnel out of the nitride charge storage layer 403 at one end 405 of the NROM device 400. There are relatively few electrons trapped in this layer 403 while the charge stored on the DRAM capacitor 401 consists of a 50 fC charge. This is equivalent to hundreds of thousands of electrons. Therefore, the few electrons discharged from the nitride layer 403 during this erase operation will not change the potential of the DRAM capacitor 401. If the erase operation is not performed, the nitride layer 403 will remain charged.

A read operation of the memory device of the present invention is subsequently described with reference to FIGS. 5-7. FIG. 7 illustrates a flow chart of a method for accessing the memory device.

After the system in which the memory device is located is initialized, a check is performed 701 to determine whether the memory cells are being accessed as a DRAM (dynamic mode) or as a non-volatile memory (repressed mode). In one embodiment, the dynamic and repressed memory modes of the present invention are signaled by the magnitude of the voltage applied to the word line.

If the memory cells are to be operated as a DRAM 703, either a normal read or write operation can be performed. Both the read and write DRAM operations are well known in the art and are not described further. As long as the voltage applied to the word line remains in the normal operating range of the transistor (e.g., 3.0 V), the tunneling voltages of the nitride layer are not exceeded and the charge state of the nitride layer remains unchanged.

If a read operation is to be performed in the NVRAM mode of operation, the stored potential charges in the NROM nitride layer affect the threshold voltage of the transfer gate. This fact can be used to distinguish between digital values stored in the memory cell during the NVRAM mode of operation. In other words, a difference in threshold voltage of the transfer device has no effect on the potential transferred to the bit line. But it will affect the rate at which the charge is transferred. The difference in threshold voltage, $V_T$, and resistance of the transfer device determines only the current. The DRAM sense amplifiers respond only to potential differences, thus small changes in $V_T$ has no significant impact on the operation of the memory cell in the DRAM mode. This is because the applied voltage is as high above $V_T$ as possible.

The word line capacitance of the memory device of the present invention is comparable to a conventional DRAM cell. During operation as a normal DRAM, the transistor just transfers a charge from the storage capacitor onto the bit line. A difference in $V_T$ of the transfer device has no effect on the amount of charge transferred, only the rate at which it is transferred. The difference in threshold voltage may determine only the current but the sense amplifier responds to charge differences in DRAM operation. Smaller differences in threshold voltage may slightly affect the response time but not the final charge sensed. This is the determining factor in DRAM operation.

During normal DRAM operation, the word line is driven to a voltage as far as possible in excess of the threshold voltage of the transfer device. This minimizes the resistance of the transfer device which could typically be a few thousand ohms. This results in the charge being transferred to the bit line capacitance in a sub-nanosecond time period and the sense amplifier subsequently responding quickly.

Reading the NROM transistor during the NVRAM mode of operation 705, the DRAM sense amplifier can be employed to determine current differences by observation of the response time of the sense amplifier. This is accomplished by using small transfer device currents and observing long response times. The word line is driven to a voltage only slightly in excess of the threshold voltage so that the current, $I_{DS}$, through the transfer device is small. This results in a very slow response of the sense amplifier. In this manner, differences in threshold voltage can be determined by measuring the differences in response time.

In order to detect the repressed memory in the NVRAM mode, sensing time should be increased. Using a ×16 memory structure, it might take as long as 0.1 minute to totally download the repressed data stored in a 64×16 memory. This is indicative of an individual bit access time of about 1.5 microseconds.

In an alternate embodiment, the repressed memory state stored in the nitride layer can be determined as a separate operation by independently measuring the threshold voltage of the transfer device. The storage capacitor can first be fully charged and then the current supplied by the transfer device to the sense amplifier can be measured at many different gate voltages. This numerical data can then be used to calculate the threshold voltage.

Figure 5:
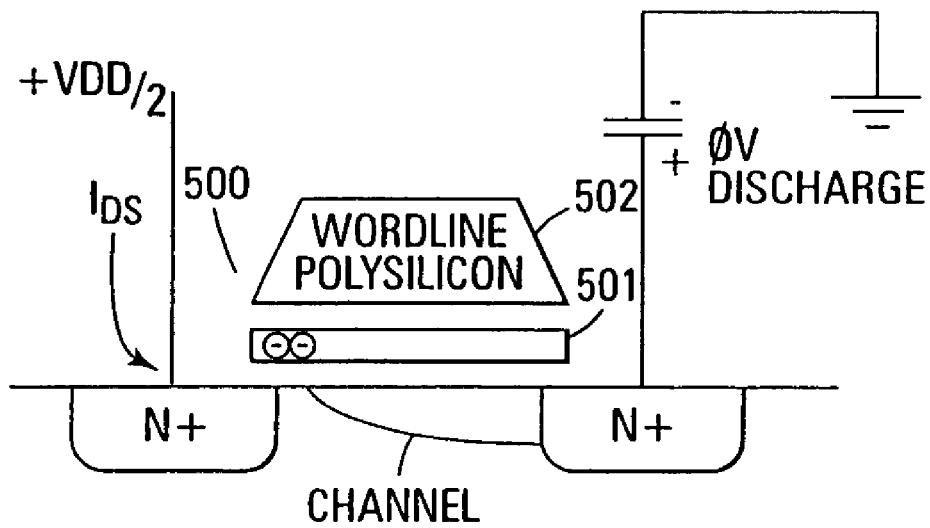
FIG. 5 shows a cross-sectional view of one embodiment of a read operation of an NROM cell when the cell is erased.

FIG. 5 illustrates a cross-sectional view of one embodiment of a read operation of an NROM cell when the cell is erased. As discussed above, data stored in the DRAM capacitor represents the presence or absence of a stored charge and the data in the NROM nitride layer 501 represents first and second values of the threshold voltage of the transistor. In the latter case, the presence or absence of the stored charge are determined by the sense amplifier while the first and second values are calculable based on numerical data generated by the sense amplifier.

Since the nitride layer 501 of FIG. 5 does not have a stored charge, the threshold voltage of the NROM transistor 500 has a lower threshold voltage than a programmed cell. When a bias that is slightly larger than $V_T$ is applied to the wordline 502, a large IDS results. The response time of the sense amplifier is then measured. A fast response time indicates the larger current and, thus, the fact that the NROM cell is not programmed.

Figure 6:
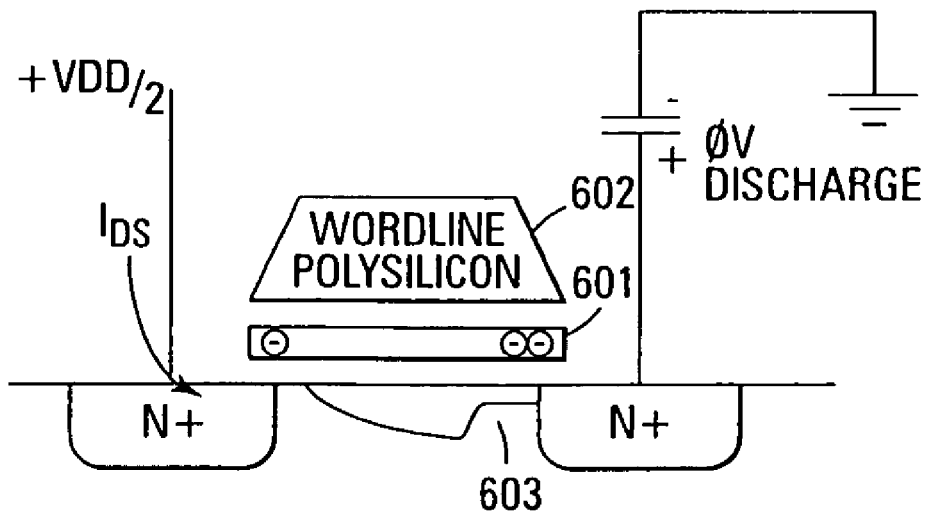
FIG. 6 shows a cross-sectional view of one embodiment of a read operation of an NROM cell when the cell is charged.
Figure 7:
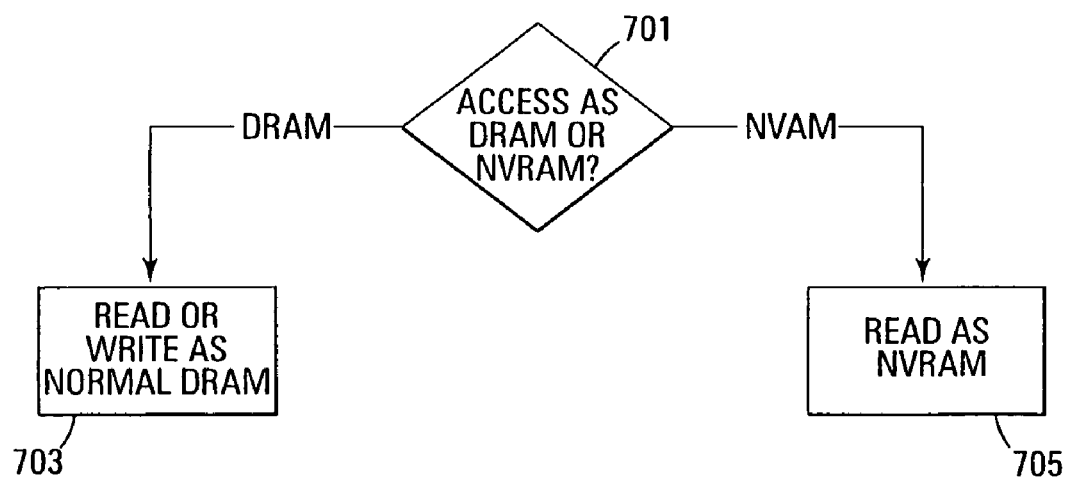
FIG. 7 shows a flow chart of one embodiment for accessing the memory device of the present invention.

FIG. 6 illustrates a cross-sectional view of one embodiment of a read operation of an NROM cell when the nitride layer 601 is storing a charge. In this embodiment, the NROM transistor has a higher threshold voltage in the indicated channel region 603 due to the stored charge. When a bias that is slightly larger than $V_T$ is applied to the word line 602, a smaller $I_{DS}$ results. The response time of the sense amplifier is then measured. A longer response time indicates a smaller current than an erased cell and, thus, the fact that the NROM cell is programmed.

Figure 8:
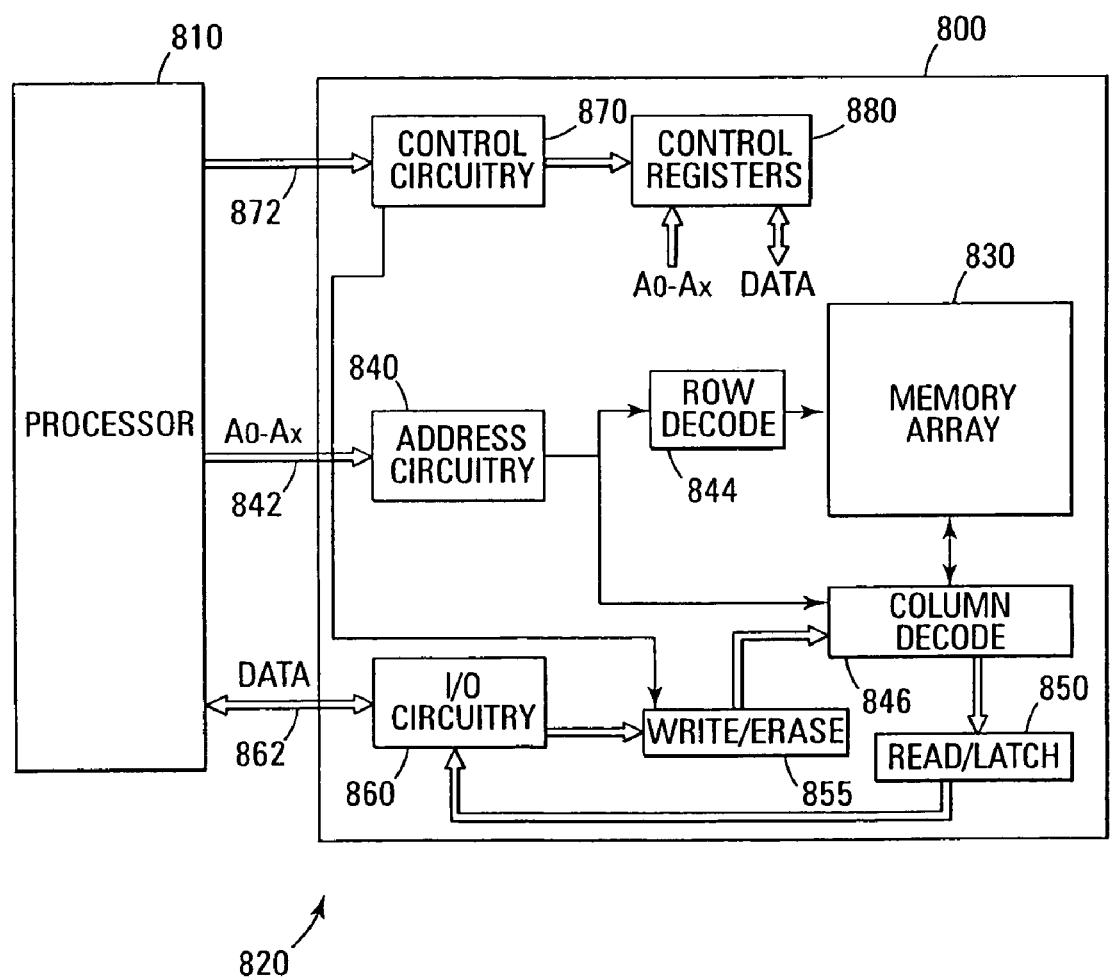
FIG. 8 shows a block diagram of an electronic system of the present invention.

FIG. 8 illustrates a functional block diagram of a memory device 800 that can incorporate the DRAM with repressed NROM memory cells of the present invention. The memory device 800 is coupled to a processor 810. The processor 810 may be a microprocessor or some other type of controlling circuitry. The memory device 800 and the processor 810 form part of an electronic system 820. The memory device 800 has been simplified to focus on features of the memory that are helpful in understanding the present invention.

The memory device includes an array of memory cells 830 that can be NROM cells integrated with DRAM cells. In one embodiment, all of the cells of the array are integrated NROM/DRAM cells of the present invention. Alternate embodiments have other quantities of integrated NROM/DRAM cells.

The memory array 830 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense/buffer circuitry 850 as described previously with reference to FIGS. 5 and 6. The sense/buffer circuitry, in one embodiment, is coupled to read and latch a row of data from the memory array 830. Data input and output buffer circuitry 860 is included for bi-directional data communication over a plurality of data connections 862 with the controller 810). Write circuitry 855 is provided to write data to the memory array.

Control circuitry 870 decodes signals provided on control connections 872 from the processor 810. These signals are used to control the operations on the memory array 830, including read, write, and erase operations. The control circuitry 870 may be a state machine, a sequencer, or some other type of controller.

Since the NROM memory cells of the present invention use a CMOS compatible process, the memory device 800 of FIG. 8 may be an embedded device with a CMOS processor.

The memory device illustrated in FIG. 8 has been simplified to facilitate a basic understanding of the features of the memory. A more detailed understanding of internal circuitry and functions of DRAM and NROM memories are known to those skilled in the art.

CONCLUSION

In summary, the embodiments of the present invention provide a one transistor/one capacitor memory device having multiple modes of operation. The memory device can operate in a DRAM mode in which the device is written and read from in a normal DRAM manner. The device can also operate in a repressed, non-volatile random access memory mode (NVRAM), using an NROM transfer device, where the NVRAM can be a completely separate memory or to shadow and/or back-up data stored in the DRAM.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for operating an NROM flash memory cell having an integrated dynamic random access memory (DRAM), an NROM transistor transfer gate having a control gate, and a plurality of modes, the method comprising:
    determining a mode of the memory cell;
    transferring data from the DRAM to the NROM transistor in response to a first mode of the plurality of modes and a negative voltage on the control gate for a predetermined period of time;
    operating the NROM transistor as a transfer gate for the DRAM in a second mode of the plurality of modes; and
    operating the NROM transistor as an NROM memory cell storing different data than the DRAM in a third mode of the plurality of modes.

2. The method of claim 1 and further including detecting a power-down condition in the memory cell prior to transferring.

3. The method of claim 1 wherein the predetermined period of time is less than 5 milliseconds.

4. The method of claim 1 wherein the first, second and third mode of operation is determined by a magnitude of the voltage applied to the control gate.

5. A method for operating a memory device comprising a dynamic random access memory (DRAM) coupled to a non-volatile transistor having a nitride trapping layer and a control gate, the method comprising:
    writing data into the DRAM in response to a first potential on the control gate;
    writing data into the transistor in response to a second potential on the control gate, the second potential being different than the first potential, wherein data written into the transistor differ from data stored in the DRAM.

6. The method of claim 5 wherein the second potential has a greater magnitude than the first potential and less than a maximum operating voltage of the transistor.

7. The method of claim 5 and further including biasing the source region at −½V.

8. The method of claim 5 wherein the first and second potentials are positive voltages.

9. The method of claim 5 and further including creating direct tunneling to the nitride trapping layer in response to a voltage difference across the nitride trapping layer of the transistor.

10. A memory device comprising:
    a memory array having a plurality of non-volatile memory cells having a plurality of operation modes, each memory cell comprising a DRAM and a transistor, the transistor coupled between a capacitor and a data line and adapted to function as a transfer gate for the DRAM or as a memory storage device independent of the DRAM, the transistor comprising a control gate and a data storage layer; and
    control circuitry that is adapted to execute a programming operation of the memory array comprising applying a negative voltage to predetermined control gates, selected for programming, for a predetermined period of time in response to a power-down condition of the memory device.

11. The memory device of claim 10 wherein the negative voltage on the control gates transfers data from the DRAM to the transistor.

12. The memory device of claim 10 wherein the transistor is coupled to other transistors in an array row by a word line coupled to the control gate of each transistor in the row.

13. The memory device of claim 10 wherein the DRAM comprises a capacitor that is coupled between array ground and one of either a source or drain region of the transistor.

14. The memory device of claim 10 wherein the transistor transfers data from the DRAM to a data line when the control gate is biased at a voltage that is greater than a threshold voltage of the transistor.

15. An electronic system comprising:
    a processor that generates control signals; and
    a memory device coupled to the processor and operating in response to the control signals, the device comprising:
        a memory array having a plurality of non-volatile memory cells having a plurality of operation modes, each memory cell comprising a DRAM and a transistor, the transistor coupled between the capacitor and a data line and adapted to function as a transfer gate for the DRAM or as a memory storage device that stores data independent of the DRAM, the transistor comprising a control gate and a data storage layer; and
        control circuitry that is adapted to execute a programming operation of the memory array comprising applying a negative voltage to predetermined control gates, selected for programming, for a predetermined period of time in response to a power-down condition of the memory device.

16. The system of claim 15 wherein the transistor operates as a shadow memory for the DRAM such that data from the DRAM is written to the transistor upon a power-down condition of the system.

17. The system of claim 15 and further including a sense amplifier coupled to the data line.

18. The system of claim 15 wherein the control circuitry is further adapted to apply a first potential to each control gate to write data into the DRAM and apply a second potential to each control gate to write data into the transistor, the second potential different from the first potential.

19. The system of claim 18 wherein the first and second potentials are positive voltages such that the second potential has a greater magnitude than the first potential and less than a maximum operating voltage of the transistor.

* * * * *